(12) United States Patent
Wang et al.

(10) Patent No.: US 6,380,050 B1
(45) Date of Patent: Apr. 30, 2002

(54) METHOD OF EPITAXIALLY GROWING A GAN SEMICONDUCTOR LAYER

(75) Inventors: Wang Nang Wang, Bath (GB); Yurii Georgievich Shreter; Yurii Toomasovich Rebane, both of St. Petersburg (RU)

(73) Assignee: Arima Optoelectronics Corporation, Taipei (TW)

( * ) Notice: Subject to any disclaimer, the term of this patent is extended or adjusted under 35 U.S.C. 154(b) by 0 days.

(21) Appl. No.: 09/616,725

(22) Filed: Jul. 14, 2000

(30) Foreign Application Priority Data

Jul. 14, 1999 (GB) ................................................ 9916549

(51) Int. Cl.⁷ ............................................... H01L 21/20
(52) U.S. Cl. ...................................................... 438/478
(58) Field of Search ............................ 438/46, 47, 478, 438/483, 486, 938

(56) References Cited

U.S. PATENT DOCUMENTS 6,107,113 A * 8/2000 Harmand et al. ............. 438/46

FOREIGN PATENT DOCUMENTS

EP 0848414 * 6/1998

* cited by examiner

Primary Examiner—Keith Christianson
(74) Attorney, Agent, or Firm—Christie, Parker & Hale, LLP

(57) ABSTRACT

A method for growth of strain free epitaxial layers of semiconductors on highly lattice mismatched substrates is suggested using a buffer layer with a solid-liquid phase transition to accommodate high mismatch between substrate and semiconductor.

6 Claims, 1 Drawing Sheet

METHOD OF EPITAXIALLY GROWING A GAN SEMICONDUCTOR LAYER

BACKGROUND OF THE INVENTION

1. Field of the Invention

The present invention relates to a method of epitaxially growing a GaN semiconductor layer on a highly lattice mismatched substrate.

2. Description of the Prior Art

The epitaxial growth of a semiconductor on a highly mismatched substrate results in extremely strained semiconductor layers. This strain gives rise to the formation of many extended defects such as dislocations, grain boundaries, stacking faults, inversion domains, and is generally responsible for the poor quality of grown semiconductor layers. Buffer layers have been used for several decades for strain reduction and improving the quality of grown semiconductor layers. Usually, buffer layers are made of solid polycrystalline or amorphous semiconductors. Such buffer layers allow the elimination of up to 90% of the strain.

SUMMARY OF THE INVENTION

It is an object of the present invention to provide a growth method that allows the substantial elimination of the strain resulting from high mismatch between the lattice parameters of a semiconductor and a substrate on which the semiconductor is grown.

According to the present invention, there is provided a method of epitaxially growing a GaN semiconductor layer on a highly mismatched substrate using a buffer layer with a solid-liquid phase transition comprising:

the epitaxial growth on the substrate of the buffer layer at a temperature lower than the melting temperature of the buffer layer;

the epitaxial growth on the buffer layer at a temperature lower than the melting temperature of the buffer layer of a protective layer with a melting temperature higher than the growth temperature of the GaN semiconductor layer to be epitaxially grown; and the epitaxial growth on the protective layer at a temperature higher than the melting temperature of the buffer layer of the epitaxial GaN semiconductor layer with a thickness greater than the thickness of the protective layer.

The growth of the epitaxial GaN semiconductor layer occurs on the thin protective layer which maintains the flatness of the liquid buffer layer and protects it from formation of liquid droplets on the substrate surface.

Since the protective layer is thin and weakly mechanically coupled to the substrate via the thin liquid buffer layer, it serves as a compliant substrate for the epitaxial GaN semiconductor layer.

Thus, the use of a buffer layer with solid-liquid phase transition allows the growth of high quality strain-free epitaxial semiconductor layers on highly mismatched substrates.

The buffer layer could be one of a metal, a metal alloy, a semiconductor alloy, a metal-semiconductor alloy and an ionic crystal of groups I–VII or II–VI.

The buffer layer could be one of Al, Cu, Mg, Pb, Au, Ag and their alloys, the substrate being one of sapphire and SiC.

The buffer layer could be one of Al, Cu, Mg, Pb, Au, Ag and their alloys, the substrate being one of sapphire and SiC.

The protective layer could be one of MgO, $Al_2O_3$, AlN, GaN, InN and their alloys, the substrate being one of sapphire and SiC and the buffer layer being one of epitaxial AlN, GaN, InN and their alloys.

The buffer layer preferably has a thickness from 5 Å to 500 Å.

The protective layer preferably has a thickness from 5 Å to 500 Å.

DETAILED DESCRIPTION OF THE PREFERRED EMBODIMENTS

Figure 1A:
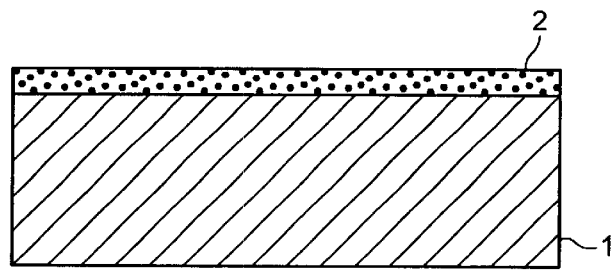
FIGS. 1 a–d illustrate stages in examples of methods according to the present invention.
Figure 1B:
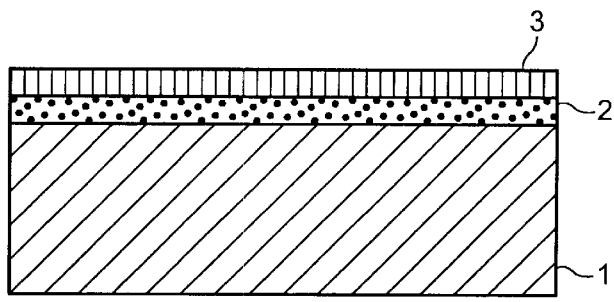
Figure 1C:
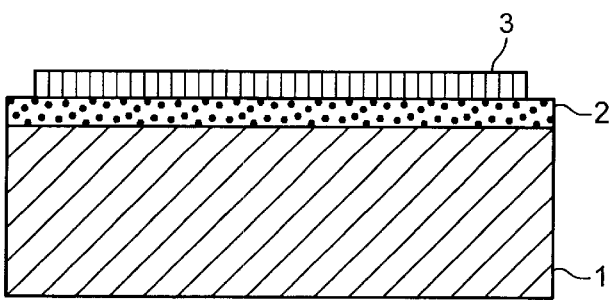
Figure 1D:
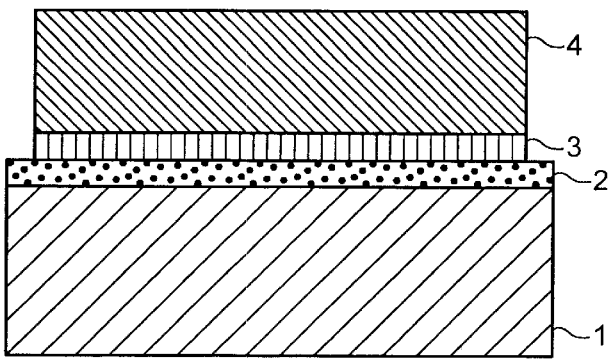

FIGS. 1 a–d show the principal stages of the growth of an epitaxial semiconductor layer using a buffer layer with a solid-liquid phase transition in each of the examples.

At a first stage (see FIG. 1a), a buffer 2 layer with a thickness from 5 Å to 500 Å is epitaxially grown on a substrate 31 at a temperature lower than its melting temperature.

At a second stage (see FIG. 1b), a protective layer 3 with a thickness from 5 Å to 500 Å and a melting temperature higher than the growth temperature of the epitaxial semiconductor layer is epitaxially grown on the buffer layer 2 at a temperature lower than the melting temperature of the buffer layer 2.

At the beginning of a third stage, temperature is raised to the growth temperature of the epitaxial semiconductor layer. The temperature rise causes melting of the buffer layer 2 and the protective layer 3 releases strain to produce the structure shown in FIG. 1c.

Then, a thick epitaxial GaN semiconductor layer 4 is grown on the protective layer 3. The thickness of the epitaxial semiconductor layer 4 is greater than the thickness of the protective layer 3. The protective layer 3 serves as a compliant substrate for the epitaxial semiconductor layer 4 since it is weakly coupled to the substrate 1 via the thin liquid buffer layer 2 and adjusts its lattice parameter to the lattice parameter of the thick epitaxial semiconductor layer 4.

The use of a buffer layer with a solid-liquid phase transition allows the growth of high quality strain free epitaxial semiconductor layers on highly mismatched substrates.

Examples of the above will now be described.

Example 1

At the first stage (see FIG. 1a), the buffer layer 2 is of Mg with a thickness of 100 Å, and is epitaxially grown on a sapphire substrate 1 at a temperature of 600° C.

At the second stage (see FIG. 1b), the protective layer 3 is of MgO with a thickness of 50 Å and is epitaxially grown on the buffer layer 2 at a temperature of 600° C.

At the beginning of the third stage, temperature is raised to the growth temperature of 1100° C. for a GaN semiconductor layer. The temperature rise causes melting of the buffer layer 2 and the protective layer 3 releases strain to produce the structure shown in FIG. 1c.

Then, a thick GaN epitaxial semiconductor layer 4 is grown on the protective layer 3. The thickness of the epitaxial semiconductor layer 4 is greater than the thickness of the protective layer 3. The protective layer 3 serves as a compliant substrate for the epitaxial semiconductor layer 4 since it is weakly coupled to the substrate 1 via the thin liquid buffer layer 2 and adjusts its lattice parameter to the lattice parameter of the thick epitaxial semiconductor layer 4.

Example 2

At the first stage (see FIG. 1a), the buffer layer 2 is of Al with a thickness of 100 Å and is epitaxially grown on a sapphire substrate 1 at a temperature of 600° C.

At the second stage (see FIG. 1b), the protective layer 3 is of $Al_2O_3$ with a thickness of 100 Å and is epitaxially grown on the buffer layer 2 at a temperature of 600° C.

At the beginning of the third stage, temperature is raised to the growth temperature of 1150° C. for a GaN semiconductor layer. The temperature rise causes melting of the buffer layer 2 and the protective layer 3 releases strain to produce the structure shown in FIG. 1c.

Then, a thick GaN epitaxial semiconductor layer 4 is grown on the protective layer 3. The thickness of the epitaxial semiconductor layer 4 is greater than the thickness of the protective layer 3. The protective layer 3 serves as a compliant substrate for the epitaxial semiconductor layer 4 since it is weakly coupled to the substrate 1 via the thin liquid buffer layer 2 and adjusts its lattice parameter to the lattice parameter of the thick epitaxial semiconductor layer 4.

Example 3

At the first stage (see FIG. 1a), the buffer layer 2 is of Al with a thickness of 100 Å and is epitaxially grown on a sapphire substrate 1 at a temperature of 600° C.

At the second stage (see FIG. 1b), the protective layer 3 is of AlN with a thickness of 100 Å and is epitaxially grown on the buffer layer 2 at a temperature of 600° C.

At the beginning of the third stage, temperature is raised to the growth temperature of 1150° C. for a GaN semiconductor layer. The temperature rise causes melting of the buffer layer 2 and the protective layer 3 releases strain to produce the structure shown in FIG. 1c.

Then, a thick GaN epitaxial semiconductor layer 4 is grown on the protective layer 3. The thickness of the epitaxial semiconductor layer 4 is greater than the thickness of the protective layer 3. The protective layer 3 serves as a compliant substrate for the epitaxial semiconductor layer 4 since it is weakly coupled to the substrate 1 via the thin liquid buffer layer 2 and adjusts its lattice parameter to the lattice parameter of the thick epitaxial semiconductor layer 4.

Example 4

At the first stage (see FIG. 1a), the buffer layer 2 is of NaF with a thickness of 200 Å and is epitaxially grown on a sapphire substrate 1 at a temperature of 800°C.

At the second stage (see FIG. 1b), the protective layer 3 is of GaN with a thickness of 200 Å is epitaxially grown on the buffer layer 2 at a temperature of 600°C.

At the beginning of the third stage, temperature is raised to the growth temperature of 1100° C. for a GaN semiconductor layer. The temperature rise causes melting of the buffer layer 2 and the protective layer 3 releases strain to produce the structure shown in FIG. 1c.

Then, a thick GaN epitaxial semiconductor layer 4 is grown on the protective layer 3. The thickness of the epitaxial semiconductor layer 4 is greater than the thickness of the protective layer 3. The protective layer 3 serves as a compliant substrate for the epitaxial semiconductor layer 4 since it is weakly coupled to the substrate 1 via the thin liquid buffer layer 2 and adjusts its lattice parameter to the lattice parameter of the thick epitaxial semiconductor layer 4.

Example 5

At the first stage (see FIG. 1a), the buffer layer 2 is made of an alloy $Ag_{0.5}Pb_{0.5}$ (50% silver and 50% lead) with a thickness of 200 Å and is epitaxially grown on a sapphire substrate 1 at a temperature of 600°C.

At the second stage (see FIG. 1b), the protective layer 3 is of AlN with a thickness of 200 Å and is epitaxially grown on the buffer layer 2 at a temperature of 600°C.

At the beginning of the third stage, temperature is raised to the growth temperature of 1150° C. for a GaN semiconductor layer. The temperature rise causes melting of the buffer layer 2 and the protective layer 3 releases strain to produce the structure shown in FIG. 1c.

Then, a thick GaN epitaxial semiconductor layer 4 is grown on the protective layer 3. The thickness of the epitaxial semiconductor layer 4 is greater than the thickness of the protective layer 3. The protective layer 3 serves as a compliant substrate for the epitaxial semiconductor layer 4 since it is weakly coupled to the substrate 1 via the thin liquid buffer layer 2 and adjusts its lattice parameter to the lattice parameter of the thick epitaxial semiconductor layer 4.

Example 6

At the first stage (see FIG. 1a), the buffer layer 2 is made of an alloy $Cu_{0.3}Pb_{0.7}$ (30% copper and 70% lead) with a thickness of 200 Å and is epitaxially grown on a sapphire substrate 1 at a temperature of 800°C.

At the second stage (see FIG. 1b), a protective layer of AlN with a thickness of 200 Å is epitaxially grown on the buffer layer 2 at a temperature of 800°C.

At the beginning of the third stage, temperature is raised to the growth temperature of 1150° C. for a GaN semiconductor layer. The temperature rise causes melting of the buffer layer 2 and the protective layer 3 releases strain to produce the structure shown in FIG. 1c.

Then, a thick GaN epitaxial semiconductor layer 4 is grown on the protective layer 3. The thickness of the epitaxial semiconductor layer 4 is greater than the thickness of the protective layer 3. The protective layer 3 serves as a compliant substrate for the epitaxial semiconductor layer 4 since it is weakly coupled to the substrate 1 via the thin liquid buffer layer 2 and adjusts its lattice parameter to the lattice parameter of the thick epitaxial semiconductor layer 4.

What is claim is:

1. A method of epitaxially growing a GaN semiconductor layer on a highly mismatched substrate using a buffer layer with a solid-liquid phase transition comprising:

the epitaxial growth on the substrate of the buffer layer at a temperature lower than the melting temperature of the buffer layer;

the epitaxial growth on the buffer layer at a temperature lower than the melting temperature of the buffer layer of a protective layer with a melting temperature higher than the growth temperature of the GaN semiconductor layer to be epitaxially grown; and the epitaxial growth on the protective layer at a temperature higher than the melting temperature of the buffer layer of the epitaxial GaN semiconductor layer with a thickness greater than the thickness of the protective layer.

2. A method according to claim 1 wherein the buffer layer is one of a metal, a metal alloy, a semiconductor alloy, a metal-semiconductor alloy and an ionic crystal of groups I–VII or II–VI.

3. A method according to claim 1 wherein the buffer layer is one of Al, Cu, Mg, Pb, Au, Ag and their alloys, the substrate is one of sapphire and SiC.

4. A method according to claim 1 wherein the protective layer is one of Mgo, $Al_2O_3$, AlN, GaN, InN and their alloys, the substrate is one of sapphire and SiC and the buffer layer is one of epitaxial AlN, GaN, InN and their alloys.

5. A method according to claim 1 wherein the buffer layer has a thickness from 5 Å to 500 Å.

6. A method according to claim 1 wherein the protective layer has a thickness from 5 Å to 500 Å.

* * * * *